United States Patent
Kholodenko et al.

(10) Patent No.: US 6,503,368 B1
(45) Date of Patent: Jan. 7, 2003

(54) SUBSTRATE SUPPORT HAVING BONDED SECTIONS AND METHOD

(75) Inventors: Arnold Kholodenko, San Francisco, CA (US); Vijay Parkhe, Sunnyvale, CA (US); Shamouil Shamouilian, San Jose, CA (US); You Wang, Cupertino, CA (US); Wing L. Cheng, Sunnyvale, CA (US); Alexander M. Veytser, Mountain View, CA (US)

(73) Assignee: Applied Materials Inc., Santa Clara, CA (US)

( * ) Notice: Subject to any disclaimer, the term of this patent is extended or adjusted under 35 U.S.C. 154(b) by 187 days.

(21) Appl. No.: 09/607,533

(22) Filed: Jun. 29, 2000

(51) Int. Cl.⁷ .............................. C23C 16/00; C23F 1/00
(52) U.S. Cl. .............................. 156/345.51; 156/345.52; 156/345.53; 156/345.48; 118/728; 118/500; 118/723 I
(58) Field of Search .................................. 118/728, 500, 118/723 E, 723 I, 723 MW; 156/345.41, 345.43, 345.48, 345.51, 345.52, 345.53; 361/234; 279/128

(56) References Cited

U.S. PATENT DOCUMENTS

| 5,463,526 A | 10/1995 | Mundt |
| 5,539,179 A | 7/1996 | Nozawa et al. |
| 5,631,803 A | 5/1997 | Cameron et al. |
| 5,754,391 A | 5/1998 | Bates |
| 5,948,165 A * | 9/1999 | Tamura ....................... 118/500 |
| 6,019,164 A * | 2/2000 | Getchel et al. ............. 118/728 |
| 6,073,681 A * | 6/2000 | Getchel et al. ............. 118/728 |
| 6,235,146 B1 * | 5/2001 | Kadotani et al. ........ 118/723 E |
| 6,267,839 B1 * | 7/2001 | Shamouilian et al. ....... 118/728 |
| 6,280,584 B1 * | 8/2001 | Kumar et al. ............... 118/666 |
| 6,328,096 B1 * | 12/2001 | Stone et al. ................ 118/728 |

FOREIGN PATENT DOCUMENTS

JP 10303286 11/1997

OTHER PUBLICATIONS

Shamouilian, et al. High Density Plasma Process Chamber, U.S. patent application Ser. No. 08/893,599, filed Jul. 14, 1997.

* cited by examiner

Primary Examiner—Jeffrie R. Lund
(74) Attorney, Agent, or Firm—Ashok K Janah; Joseph Bach

(57) ABSTRACT

A substrate support 55 comprises first, second and third sections 88, 90, 92 connected to one another by first and second bonds 106, 108, one of the sections comprises a surface 75 adapted to receive a substrate 25. The first bond 106 comprises a first bonding material and the second bond 108 comprises a second bonding material. In one version, the first bonding material is capable of bonding surfaces when heated to a first temperature and the second bonding material is capable of bonding surfaces when heated to a second temperature.

22 Claims, 3 Drawing Sheets

SUBSTRATE SUPPORT HAVING BONDED SECTIONS AND METHOD

BACKGROUND

The invention relates to a support for supporting a substrate in a chamber and related methods.

In the manufacture of integrated circuits, a substrate is processed by a plasma of process gas in a chamber. The substrate is typically supported in the chamber by a support, a portion of which may comprise a dielectric material covering an electrode. The electrode may be charged to electrostatically hold the substrate, to energize the process gas in the chamber, or to do both. In addition, the support may comprise a heater to heat the substrate, or a heat exchanger, such as for example, channels through which heat transfer fluid may be circulated to heat or cool the substrate. In addition, a heat transfer gas, such as helium, may be introduced through a conduit in the support to below the substrate to enhance heat transfer rates to and from the substrate.

The substrate fabrication process may be performed at elevated temperatures and using erosive gases. Temperatures exceeding 100° C. in combination with gases such as halogen gases may result in rapid thermal degradation of the support. The erosion and temperature resistance may be met by using supports comprising polymer or ceramic materials, such as for example, polyimide, aluminum oxide and aluminum nitride. However, it is difficult to attach the polymer or ceramic supports to the chamber which is typically made from a metal. For example, differences in thermal expansion coefficient between the support and the chamber may cause thermal expansion stresses that result in cracking or fracturing of either structure.

Another problem that often occurs with conventional supports arises because the heat transfer gas passed through a conduit in the support may leak out from joints in the conduit. A loss in pressure of the heat transfer gas during processing may cause non-uniform heat transfer rates, and consequently non-uniform temperatures, across the substrate. It is desirable to maintain uniform heat transfer rates and temperature differentials across the substrate during its processing, otherwise, the substrate may be processed unevenly.

Therefore, it is desirable to have a support that may be used at elevated temperatures without excessive thermal expansion stresses. It is further desirable to maintain uniform heat transfer rates and temperature differentials across a substrate during its processing. It is also desirable to pass heat transfer gas through the support without excessive leakage of the gas.

SUMMARY

The present invention satisfies these needs. In one aspect, the invention comprises support capable of supporting a substrate in a chamber. The support comprises a plurality of sections that may be joined to one another or to the chamber, at least one of the sections comprising a surface adapted to receive a substrate, and first and second bonds between the sections or between a section and the chamber, the first bond comprising a first bonding material and the second bond comprising a second bonding material.

In another aspect of the invention, a substrate processing chamber comprises a substrate support comprising a plurality of sections connected to one another by first and second bonds, wherein the first bond comprises a first bonding material and the second bond comprises a second bonding material. The processing chamber further comprises a gas distributor, a gas energizer, and a gas exhaust, whereby a substrate received on the support may be processed by gas introduced through the gas distributor, energized by the gas energizer, and exhausted by the gas exhaust.

In another aspect of the invention, a substrate support comprises a first, second, and third section, the first section comprising a surface adapted to receive a substrate, and a first bond between the first and second sections and a second bond between the second and third sections, wherein the first bond comprises a first bonding material capable of bonding surfaces when heated to a first temperature and the second bond comprises a second bonding material capable of bonding surfaces when heated to a second temperature.

In another aspect of the invention a method of forming a substrate support comprises forming first, second, and third sections, the first section comprising a surface adapted to receive a substrate, providing a first bonding material between the first and second sections, and providing a second bonding material between the second and third sections.

In another aspect of the invention, a method of forming a substrate support comprises forming a plurality of sections with first and seconds bonds between the sections or between a section and a chamber, one of the sections comprising a surface adapted to receive a substrate, and heating the first bond to a first temperature and heating the second bond to a second temperature.

DRAWINGS

These features, aspects, and other advantages of the present invention will become better understood with regard to the following description, appended claims, and accompanying drawings which illustrate examples of the invention, where:

DESCRIPTION

Figure 1A:
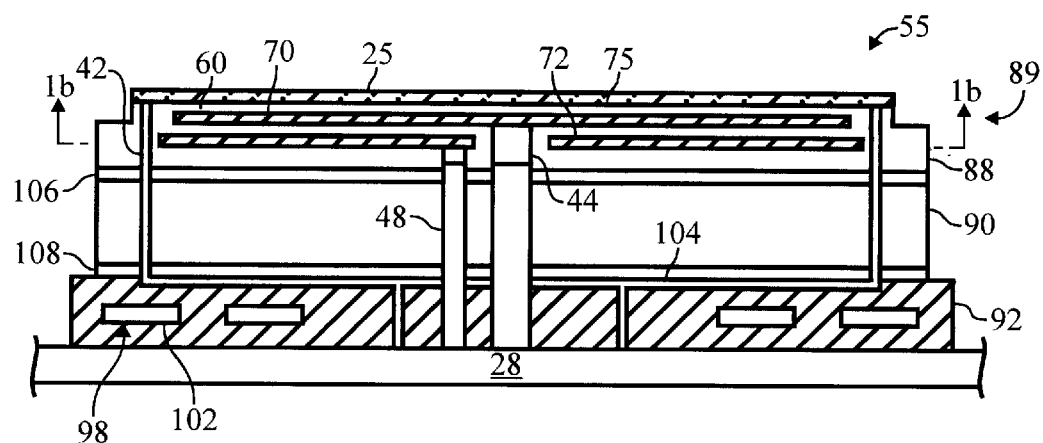
FIG. 1a is a schematic sectional side view of a support according to the present invention showing sections comprising an electrostatic chuck, a base, and a pedestal, and bonds therebetween.
Figure 1B:
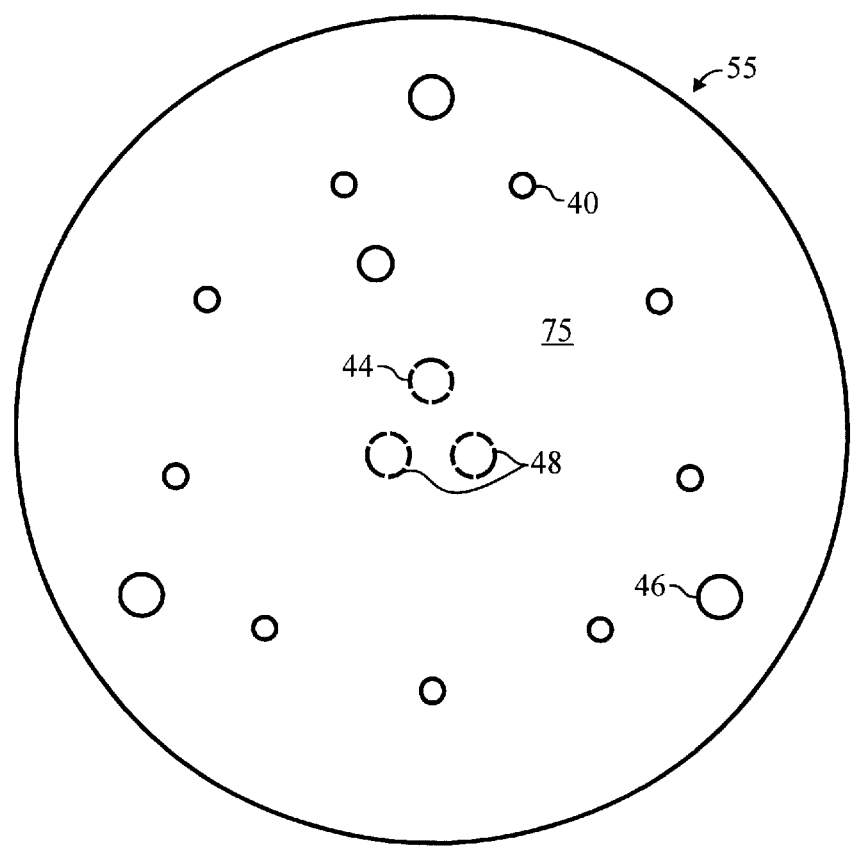
FIG. 1b is a schematic sectional top view of the support of FIG. 1a showing the holes for the passage of heat transfer gas, lift pins, electrode connectors, and heater terminals.

An exemplary embodiment of a substrate support 55 according to the present invention is illustrated in FIGS. 1a and 1b. The support 55 comprises a receiving surface 75 adapted to receive a substrate 25. The receiving surface 75 is typically the surface of a first section 88 of the support 55. The support 55 may comprise one or more additional sections, for example, a second section 90 and a third section 92, and they may be joined to one another or to a portion of a chamber 30, such as for example, a chamber wall 28. The sections 88, 90, 92 are portions of the support 55 that serve to support the substrate 25 and may also serve to control the rates of heat transfer to and from the substrate 25 to the chamber wall 28 or other chamber components. Although the version of the support 55 illustrated herein shows three sections, the support 55 may also comprise other configurations having additional sections, or fewer sections, as would be apparent to one of ordinary skill in the art. Therefore, the present invention should not be limited to the illustrative embodiments described herein.

In one version, the first section 88 comprises an electrostatic chuck 89 capable of electrostatically holding the substrate 25. A typical electrostatic chuck 89 comprises a dielectric 60 at least a portion of which covers an electrode 70 and which may surround or entirely enclose the electrode 70. Typically, the dielectric 60 is made from a material that is resistant to erosion by the gas or plasma. The dielectric 60 may preferably also be permeable to RF or DC energy applied to the electrode 70.

For example, the dielectric 60 may comprise a ceramic material, such as for example, $Al_2O_3$, AlN, BN, Si, $SiO_2$, SiC, $Si_3N_4$, $TiO_2$, $ZrO_2$, cordierite, mullite, or mixtures and compounds thereof. Generally, aluminum nitride is preferred for its high thermal conductivity to provide high heat transfer rates from the substrate 25. Aluminum nitride also exhibits good chemical resistance to erosive environments, such as halogen-containing environments. The ceramic dielectric 60 is permeable to electromagnetic energy, such as RF energy, to allow energy applied to the electrode 70 to couple to the gas in a chamber to sustain or energize a plasma of the gas. The ceramic dielectric 60 may also be partially conductive to allow a small current flow therethrough to establish an electrostatic charge that is not confined to the electrode 70 to provide a stronger electrostatic clamping force on the substrate 25. The ceramic dielectric 60 may be formed by freeze casting, injection molding, pressure-forming, thermal spraying, or sintering a ceramic block having the electrode 70.

The electrode 70 covered by and below the dielectric 60 may be adapted to be electrically chargeable to electrostatically hold the substrate 25 to the receiving surface 75, to energize the gas in a process chamber 30, or to do both. For electrostatic clamping, the electrode 70 may be a monopolar or bipolar electrode. The electrode 70 is made from an electrically conducting material, such as a metal, for example, aluminum, copper, tungsten, molybdenum or mixtures thereof. Molybdenum has a good thermal conductivity and resistance in corrosion in non-oxidizing environments, such as when the electrode 70 is embedded in the dielectric 60. The electrode 70 comprises a generally planar shape conformal to the shape of the substrate 25. For example, the electrode 70 may be a mesh of electrically conducting wire (not shown) extending below substantially the entire substrate 25. Optionally, the chuck 89 may also include a heater 72 to heat the substrate 25. The heater 72 is typically an electrical resistor that extends below the plane of the substrate 25. The heater 72 may be made from, for example, tungsten, molybdenum, iron, nickel, copper, Inconel™ or alloys thereof.

The second section 90 (or base) of the support 55, is below the first section 88, and may be shaped and sized to match the shape and size of the first section 88 to control heat transfer rates across the substrate 25, for example. In one version, when the first section 88 is disk shaped, the second section 90 may comprise a right cylindrical shape having a similar diameter. The section 90 may be made from a ceramic such as one or more of aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof; or a metal such as one or more of aluminum, copper, molybdenum, stainless steel, titanium, tungsten, zirconium and their alloys thereof. Optionally, the second section 90 may be also made of a material having a coefficient of thermal expansion (CTE) that is close to the CTE of the first section 88 to reduce thermal expansion stresses therebetween, for example, a CTE that is within about ±20% of the CTE of that of the first section 88. For example, when the dielectric 60 comprises aluminum nitride, the second section 90 may be made from mullite which has a CTE close to the CTE of aluminum nitride.

The third section 92 may also be shaped and sized to match the shape and size of the first and second sections 88, 90 to further enhance control over the substrate heat transfer rates. For example, when the first and second sections 88, 90 are disk shaped, the third section 92 may comprise a right cylindrical shape having a similar diameter. The section 92 may also be made from a ceramic such as one or more of aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof; or a metal such as one or more of aluminum, copper, molybdenum, stainless steel, titanium, tungsten, zirconium and their alloys thereof. In one version, the section 92 may be also fabricated from a material having a CTE that is within about ±20% of the CTE of the second section 90. For example, for the aforementioned aluminum nitride and mullite example, a suitable material for fabricating the section 92 may comprise zirconium.

Any of the sections 88, 90, 92 may comprise holes 40 (as shown in FIG. 1b) for the passage of gas conduits 42 to supply heat transfer gas to the receiving surface 75, electrode connectors 44, heater terminals 48 or lift pins 46 therethrough. One or more of the sections 88, 90, 92 may also comprise a heat exchanger 98 to maintain the temperature of the substrate 30. A typical heat exchanger 98 comprises channels 102 through which a heat transfer fluid may be circulated to heat or cool the substrate 25. The sections 88, 90, or 92 may also comprise a channel 104 to transport heat transfer gas to the gas conduits 42.

Referring back to FIG. 1a, the first section 88 is bonded to the second section 90, and the second section 90 is bonded to the third section 92, by one or more bond layers 106, 108. During substrate processing, there is generally a temperature differential between the sections 88, 90, and 92. It has been discovered that bonding sections 88, 90, and 92 to one another by bond layers 106, 108 that are processed at predetermined temperatures selected in relation to a measured (or calculated) operating temperature of the sections 88, 90, 92 (or the interfaces between the sections) significantly improves the thermal stability of the joint. Generally, during processing of a substrate 25, the energized gas above the substrate 25 heats up the substrate 25. This thermal energy is dissipated via the support 55 into a heat exchanger 98 or a chamber wall 28 or the like. In the process of heat conduction from the substrate 25 through the support 55 and into the chamber wall 28 or heat exchanger 98, a temperature gradient is established in the support 55.

The temperature gradient may cause the different sections 88, 90, 92 of the support 55 to be at different temperatures during substrate processing which would result in thermal stresses across the sections. In addition, the sections 88, 90, 92 may achieve equilibrium temperatures during processing of a substrate 25, at which temperatures, they have expanded by a predetermined amount. This is a problem when the different sections 88, 90, 92, or portions of a single section, are made from materials that have different thermal expansion coefficients. Each material can expand by a different amount at the equilibrium temperature which would cause thermal stresses across the different sections 88, 90, 92. These thermal stresses may cause the sections 88, 90, 92 to separate from one another or may cause the substrate 25 to move or become misaligned during processing.

It has been further discovered that bonding the sections 88, 90, 92 with one more bond layers 106, 108 each comprising a bonding material that can form a bond at a temperature selected in relation to a substrate processing temperature—will substantially alleviate thermal stresses. Each bond layer 106, 108 comprises a bonding material capable of forming a bond at a particular temperature. Thus, different bonding materials may be selected in relation to a temperature gradient that occurs across the different sections 88, 90, 92 of the support 55 during substrate processing. For example, when the first section 88 is attached to the second section 92, the bonding material may be selected to form a bond 106 at a first temperature that is related to the operational temperature at the interface of the first and second sections 88, 90. For example, the bonding material may be selected to form a bond at a temperature of about 700° C. As another example, when the support comprises a third section 92, and bonding material for the bond layer between the second and third section 90, 92 is selected to form a bond at a second temperature, that is related to an operational temperature at an interface of the second and third section 90, 92. In such a support, the bond layer 108 is formed at a temperature close to an operational temperature of that interface and to closely match the same temperature differential or gradient occurring at that region of the support 55. Typically, the bonding materials selected to join the different sections are materials that form bonds at temperatures of about ±350° C. of the substrate processing temperature.

Thus, when the support 55 comprises a plurality of sections 88, 90, 92, a number of bond layers 106, 108 comprising the same or different materials may be used to join any two of the sections 88, 90, 92. In one version, the bonding material for forming a first bond between the first and second sections 88, 90 is selected to join the sections at a higher temperature than the temperature of the bonding material used to form a bond between the second and third section 90, 92. This version is useful when the substrate is maintained at temperatures higher than ambient temperatures during processing, for example, in a dielectric etching process, the substrate 25 may reach temperatures of at least 300° C. during plasma etching. The temperature gradient across the support 55 may comprise temperatures of from about 150° C. to about 250° C. Thus, the bonding material of the first bond 106 is selected to form a bond at a temperature of at least about 600° C., and more typically from about 600° C. to about 800° C.; and the bonding material of the second bond 108 is selected to form a bond at a temperature of less than about 500° C., and more typically from about 100° C. to about 400° C.

The bonding materials may be compliant or ductile to absorb thermal stresses that arise from differences in thermal expansion coefficients of dissimilar materials, such as for example, an AlN ceramic first section 88 and a mullite second section 90, to reduce thermo-mechanical stresses. In one version, the first bonding material for forming the first bond 106 comprises a metal containing layer, such as for example, one or more layers of copper, iron, molybdenum, titanium, tungsten or alloys thereof. For example, when the first section 88 comprises an aluminum nitride dielectric material enclosing a molybdenum electrode, and the second section 90 comprises mullite, a suitable metal containing layer comprises a Mo foil covered with a copper layer. A brazed metal layer is used to braze the metal layer to the first section 88. The brazing alloy should have a melting point lower than the dielectric 60 or second section 90. In fabrication, a thin sheet of brazing metal (not shown) is placed between the first section 88 and the second section 90 and heated to allow the metal to soften and react to form the first bond layer 106. The brazing metal typically comprises aluminum, zinc, copper, silicon, or alloys thereof. For example, a suitable brazing alloy comprises Cusin-1-ABA™ which melts at 775° C.

Figure 2B:
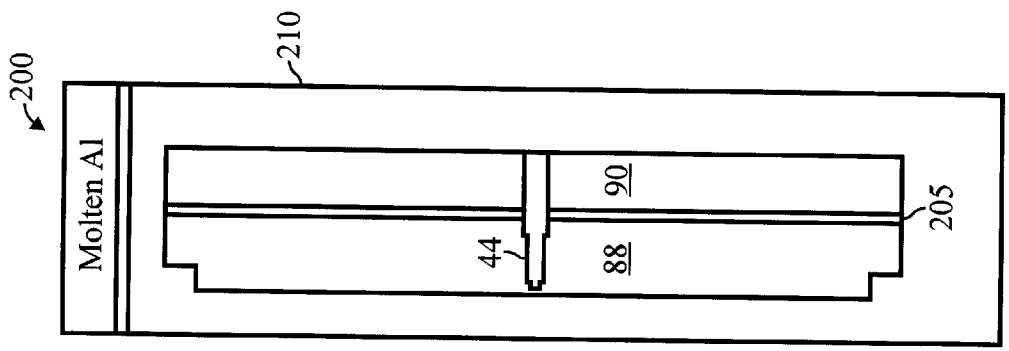
FIGS. 2a through 2c are schematic diagrams of steps in an exemplary process of fabricating a support according to the present invention showing assembly of the first and second sections, infiltration of metal to form a bond therebetween, and machining of the support.
Figure 2A:
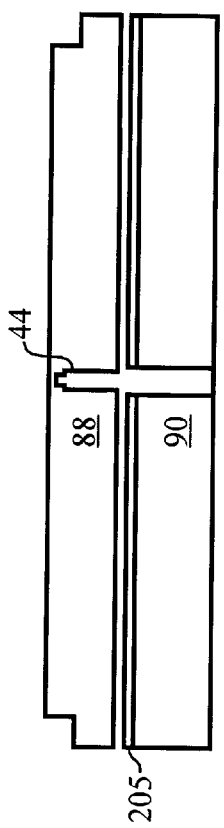
Figure 2C:
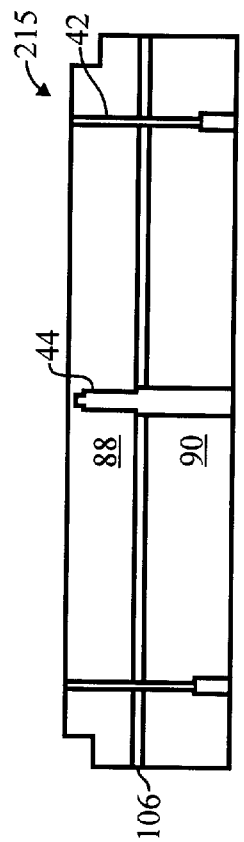

In another method of forming the first bond 106, a molten or liquid metal material is infiltrated into a preform 205 positioned between the first section 88 and the second section 90, as schematically illustrated in FIGS. 2a through 2c.

Referring to FIG. 2a, a preform 205 may be placed between the first section 88 and the second section 90 during the infiltration process, so that the molten metal infiltrates into the preform and across the surfaces between the first section 88 and the second section 90, to form the bond layer 106, as for example described in U.S. patent application Ser. No. 09/306,934, filed May 7, 1999, which is incorporated herein by reference. A suitable preform 205 comprises a silicon carbide member having a pore volume of 70% or a slurry of silicon carbide, each of which is infiltrated by molten aluminum at 600° C. Referring to FIG. 2b, the metal infiltration can be accomplished by, for example, melting the metal and allowing the molten metal to infiltrate the interface by capillary action in a pressure forming apparatus 200. The molten metal may be filtered by a filter between the metal feedstock and an interface of the sections 88, 90. The infiltration may also be performed in a pressure vessel 210 by applying a pressure of about 10 to about 500 psi (500 to 30,000 Torr), and more typically about 100 to 300 psi. The molten metal is maintained at its melting or softening point during the pressure infiltration process and in a non-reactive gas environment, such in nitrogen or argon gas. The pressure forming apparatus 200 may also be evacuated to remove air trapped at the interface of the sections 88, 90 using conventional vacuum bag methods, as for example, described in U.S. Pat. No. 5,745,331. A suitable pressure forming apparatus is an autoclave, platen press or isostatic press. In the infiltration process, the molten metal may react with the dielectric 70 to form an interfacial reaction layer that is free of voids and provides uniform thermal transfer rates across the interface. Thereafter, the resultant intermediate structure 215, as shown in FIG. 2c, is machined to form holes and bores for the passage of heat transfer gas conduits, connectors or terminals, using conventional methods. The surfaces of the structure 215 may also be machined to adjust surface smoothness tolerances.

In one version, the second bond 108 comprises a polymer that may include a polymer adhesive, paste, liquid, or gel, for example, polyimide, polyketone, polycarbonate, polyvinylchloride, and mixtures thereof. In addition, the polymer may be capable of withstanding higher temperatures and be sufficiently compliant to withstand a CTE mismatch of at least about 20%. For example, a suitable polymer comprises a thermoplastic adhesive that is reworkable and is not completely polymerized at high temperatures. Thermoplastics remain compliant and allow the bonding of materials having a large CTE mismatches because they do not set and because they have a relatively low softening point of less than about 500° C. Typically, many thermoplastic polymers have an elastic modulus of less than about $100 \times 10^3$ psi. Suitable thermoplastic adhesives comprise, for example, KJ-100 or KJ-200™ which are commercially available from Dupont de Nemours Company, Wilmington, Del., and which are laminated at a temperature of from about 350 to 400° C. and a pressure of 150 to 200 psi. Another suitable material is STAYSTIK thermoplastic adhesive no 672™—commercially available from Alphametals, Inc., Jersey City, N.J.—which has an bonding temperature of about 125 to 200° C.

The thickness of the polymer layer is typically from about 2 to 10 mils. In another version, the second bond 108 comprises a lower temperature material, such as a low melting point metal, for example a low temperature brazing alloy or solder, which may include aluminum, indium, lead, magnesium, tin, zinc, copper, silicon, or alloys thereof.

In one method of fabricating the second bond 108, a pressure forming process is used. In this method, a polymer film loaded with particulates, such as the aforementioned STAYSTIK thermoplastic adhesive no. 672 is placed between the second and third section 90, 92. This assembly is then placed in a pressure forming apparatus (not shown) which is maintained at a pressure of about 10 to about 500 psi (500 to 30,000 Torr). When the film comprises a thermoplastic adhesive, lower pressures are preferred to avoid excessive squeezing out too much of the polymer adhesive, the pressures typically ranging from about 10 to 25 psi (500 to 13,000 Torr). The assembly is then heated to a temperature sufficiently high to soften and bond the polymer between the second section 90 and the third section 92. A typical cycle comprises temperatures of 30 to 120° C., a pressure of about 200 psi (10,000 Torr) and a total time of about 30 minutes. Simultaneously with applying a pressure and temperature on the assembly it may also be desirable to evacuate and remove air trapped in the polymer by conventional vacuum bag methods, as for example, described in U.S. Pat. No. 5,745,331, which is incorporated herein by reference.

Figure 3:
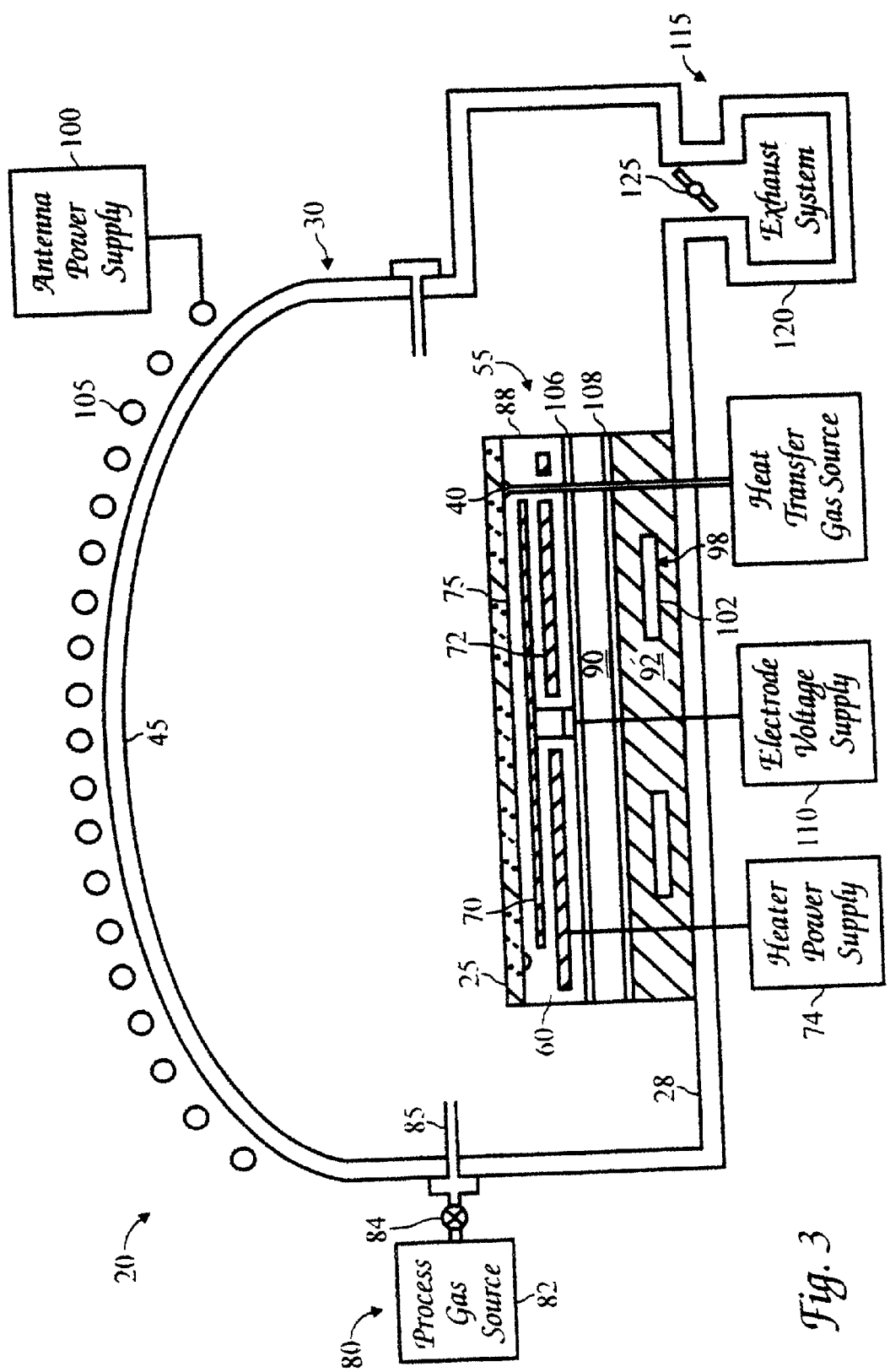
FIG. 3 is a schematic side view of a chamber and support according to the present invention.

Referring to FIG. 3, a support 55 according to the present invention may be used in an apparatus 20 to hold a substrate 25 for processing in an energized gas or plasma. The apparatus 20 may be, for example, a "DPS" chamber (as schematically illustrated herein), an IPS chamber, or a M×P+chamber—all of which are commercially available from Applied Materials, Inc., Santa Clara, Calif. The exemplary version of the apparatus 20 shown herein is suitable for processing substrates 25 such as semiconductor wafers, and may be adapted by those of ordinary skill to process other substrates, such as flat panel display, polymer panels, or other structures for electronic applications. The apparatus 20 is provided only to illustrate the invention and should not be used to limit the scope of the invention or its equivalents. The apparatus 20 may be attached to a multichamber platform (not shown) that provides electrical, plumbing, and other support functions for the apparatus 20, such as for example, the Precision 5000™ systems from Applied Materials, Inc., of Santa Clara, Calif.

Generally, the apparatus 20 comprises an enclosed chamber 30 having walls 28 and a ceiling 45, the walls 28 include a bottom wall upon which rests the support 55 for supporting the substrate 25. In operation, a substrate 25 is transferred from a load-lock chamber and placed on the receiving surface 75 of the support 55. Process gas is introduced into the chamber 30 by a gas supply 80 comprising a plurality of gas nozzles 85 that are fed from a process gas source 82, the gas flow being controlled by one or more gas valves 84. The gas may be energized by coupling electromagnetic energy, such as RF or microwave energy, to the gas. In the exemplary apparatus 20, a plasma of energized gas is sustained by inductively coupling RF power from an inductor antenna 105 adjacent to the ceiling 45 of the chamber 30, the antenna 105 being powered by a power supply 100.

Optionally, the gas may be further energized capacitively by applying an RF voltage from an electrode voltage supply 110 to the electrode 70 in the support 55 and by electrically grounding the walls 28 of the chamber 30. A heater power supply 74 may be used to electrically power the heater 72. Spent gas and byproducts are exhausted from the chamber 30 through an exhaust system 115 which typically includes vacuum pumps (not shown) and a throttle valve 125 to control the pressure in the chamber 30. The apparatus 20 illustrated herein may be used to etch material from a semiconductor wafer substrate 25, as generally described, for example, in *VLSI Technology*, by S. M. Sze, McGraw-Hill Publishing Company (1988), which is incorporated herein by reference.

A support 55 according to the present invention provides enhanced thermal stability and may be tailored for particular substrate processing environments. The support 55 may compensate for a measured or calculated temperature gradient across sections 88, 90, 92 of a support 55 that arises during processing of a substrate 25. The support 55 may also provide controllable heat transfer rates from a substrate 25 by reducing the adverse effects of thermal impedances that arise from non-contacting regions at the interfaces of the sections 88, 90, or 92. The bond layers 106, 108 may also serve to reduce leakage of heat transfer gas passing through the conduits 42 to provide gas sealed interface joints with low gas leakage rates at the interfaces of the sections 88, 90, and 92. These advantages provide significant benefits in the processing of substrates 55.

While the present invention has been described in considerable detail with reference to certain preferred versions, many other versions should be apparent to those of ordinary skill in the art. For example, other sectional configurations or arrangements of the support 55 and its bond layers 106, 108 should be apparent to those of ordinary skill in the art. In addition, the support 55 may be used in other types of chambers, such as for example, CVD, PVD, ion implantation, RTD or other chambers. Therefore, the spirit and scope of the appended claims should not be limited to the description of the preferred versions contained herein.

What is claimed is:

1. A support capable of supporting a substrate in a chamber, the support comprising:

a plurality of sections that are joined to one another or to the chamber, at least one of the sections comprising a surface adapted to receive a substrate, and first and second bonds between the sections or between a section and the chamber, the first bond comprising a first bonding material and the second bond comprising a second bonding material.

2. A support according to claim 1 wherein the first bonding material is capable of forming a bond when heated to a first temperature and the second bonding material is capable of forming a bond when heated to a second temperature.

3. A support according to claim 1 wherein the first or second bond comprises one or more of indium, lead, magnesium, tin, aluminum or their alloys.

4. A support according to claim 1 wherein the first or second bond comprises a polymer.

5. A support according to claim 1 wherein the first or second bond comprises one or more of copper, iron, molybdenum, titanium, tungsten or their alloys.

6. A support according to claim 1 wherein the first or second bond comprises a bonding material capable of forming a bond when heated to at least about 600° C.

7. A support according to claim 1 wherein the first or second bond comprises a bonding material capable of forming a bond when heated to less than about 500° C.

8. A support according to claim 1 wherein the first bond comprises a bonding material capable of forming a bond when heated to at least about 600° C., and the second bond comprises a bonding material capable of forming a bond when heated to less than about 500° C.

9. A support according to claim 1 wherein the plurality of sections comprise first and second sections and wherein the first bond is between the first section and the second section.

10. A support according to claim 9 wherein the plurality of sections comprise a third section, and wherein the second bond is between the second section and the third section.

11. A support according to claim 9 wherein the second bond is between the second section and the chamber.

12. A support according to claim 1 wherein the first or second sections comprise one or more of aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof.

13. A substrate processing apparatus comprising:

is a chamber having a substrate support comprising a plurality of sections, at least one of the sections comprising a surface adapted to receive a substrate, and these sections being joined to one another or to the chamber by first and second bonds, wherein the first bond comprises a first bonding material and the second bond comprises a second bonding material;

a gas distributor;

a gas energizer; and a gas exhaust, whereby a substrate received on the support may be processed by gas introduced through the gas distributor, energized by the gas energizer, and exhausted by the gas exhaust.

14. An apparatus according to claim 13 wherein the first bonding material is capable of forming a bond when heated to a first temperature and the second bonding material is capable of forming a bond when heated to a second temperature.

15. A substrate support comprising:

a first, second, and third section, the first section comprising a surface adapted to receive a substrate;

a first bond between the first and second sections and a second bond between the second and third sections, wherein the first bond comprises a first bonding material capable of forming a bond when heated to a first temperature and the second bond comprises a second bonding material capable of forming a bond when heated to a second temperature.

16. A support according to claim 15 wherein the first or second bond comprises one or more of indium, lead, magnesium, tin, aluminum or their alloys.

17. A support according to claim 15 wherein the first or second bond comprises a polymer.

18. A support according to claim 15 wherein the first or second bond comprises one or more of copper, iron, molybdenum, titanium, tungsten or their alloys.

19. A support according to claim 15 wherein the first bond comprises a bonding material capable of forming a bond when heated to a first temperature of at least about 600° C.

20. A support according to claim 15 wherein the second bond comprises a bonding material capable of bonding the sections to one another when heated to a second temperature of less than about 500° C.

21. A support according to claim 15 wherein the sections are stacked.

22. A support according to claim 15 wherein the third section is joined to a chamber wall.

* * * * *